(12) United States Patent
Kotani

(10) Patent No.: US 7,538,397 B2
(45) Date of Patent: May 26, 2009

(54) SEMICONDUCTOR DEVICE AND METHOD FOR FABRICATING THE SAME

(75) Inventor: Naoki Kotani, Hyogo (JP)

(73) Assignee: Panasonic Corporation, Osaka (JP)

( * ) Notice: Subject to any disclaimer, the term of this patent is extended or adjusted under 35 U.S.C. 154(b) by 48 days.

(21) Appl. No.: 11/186,785

(22) Filed: Jul. 22, 2005

(65) Prior Publication Data
US 2006/0017117 A1 Jan. 26, 2006

(30) Foreign Application Priority Data
Jul. 22, 2004 (JP) .............................. 2004-214611

(51) Int. Cl.
*H01L 27/04* (2006.01)
(52) U.S. Cl. .............................. 257/380; 257/E27.004; 257/E27.016; 438/210; 438/238; 438/384
(58) Field of Classification Search ................ 438/210, 438/238, 382, 384; 257/379, 380, E27.016, 257/E27.004
See application file for complete search history.

(56) References Cited

U.S. PATENT DOCUMENTS

| 6,083,785 | A * | 7/2000 | Segawa et al. | ............... | 438/238 |
| 6,100,141 | A * | 8/2000 | Hsu | ............. | 438/283 |
| 6,124,160 | A * | 9/2000 | Segawa et al. | ............... | 438/238 |
| 6,548,389 | B2 * | 4/2003 | Moriwaki et al. | ............ | 438/592 |
| 6,884,643 | B2 | 4/2005 | Nakanishi et al. | | |
| 6,936,520 | B2 * | 8/2005 | Yamanoue et al. | ........... | 438/383 |
| 2004/0097032 | A1 | 5/2004 | Yamanoue et al. | | |

FOREIGN PATENT DOCUMENTS

| EP | 1310998 A2 * | 5/2003 |
| JP | 61-43464 | 3/1986 |
| JP | 06-168955 | 6/1994 |
| JP | 10-209296 | 8/1998 |
| JP | 2000-340671 A | 12/2000 |
| JP | 2001-007220 | 1/2001 |
| JP | 2001-250869 | 9/2001 |
| JP | 2003-152100 A | 5/2003 |
| JP | 2003-243468 | 8/2003 |
| JP | 2004-153060 | 5/2004 |

OTHER PUBLICATIONS

Japanese Office Action issued in Japanese Patent Application No. JP 2004-214611, dated Feb. 13, 2008.

(Continued)

*Primary Examiner*—Anh Phung
*Assistant Examiner*—Michael Lulis
(74) *Attorney, Agent, or Firm*—McDermott Will & Emery LLP

(57) ABSTRACT

A semiconductor device includes a resistor element covered by a silicon oxide film. In the semiconductor device, with respective gate electrodes of MIS transistors and impurity doped layers, i.e., non-silicide regions exposed, thermal treatment for activating an impurity and silicidization are performed. Thus, auto-doping of an impurity is suppressed, so that variations in a resistance value of a resistor are suppressed. Also, the gate electrodes of the MIS transistors and the like are exposed when thermal treatment for activating an impurity, and therefore breakdown of respective gate insulation films of the MIS transistors hardly occurs.

15 Claims, 8 Drawing Sheets

OTHER PUBLICATIONS

Chinese Office Action, and English translation thereof, issued in Patent Application No. 200510085988.2 dated on Jun. 20, 2008.
Japanese Notice of Reasons for Rejection, and English translation thereof, issued in Patent Application No. 2004-214611 dated on Jun. 17, 2008.
Japanese Decision of Rejection and Decision to Dismiss the Amendment, w/ English translations thereof, issued in Japanese Patent Application No. JP 2004-214611 dated on Sep. 30, 2008.
Chinese Office Action, with English Translation, issued in Chinese Patent Application No. CN 200510085955.2, dated Dec. 5, 2008.

* cited by examiner

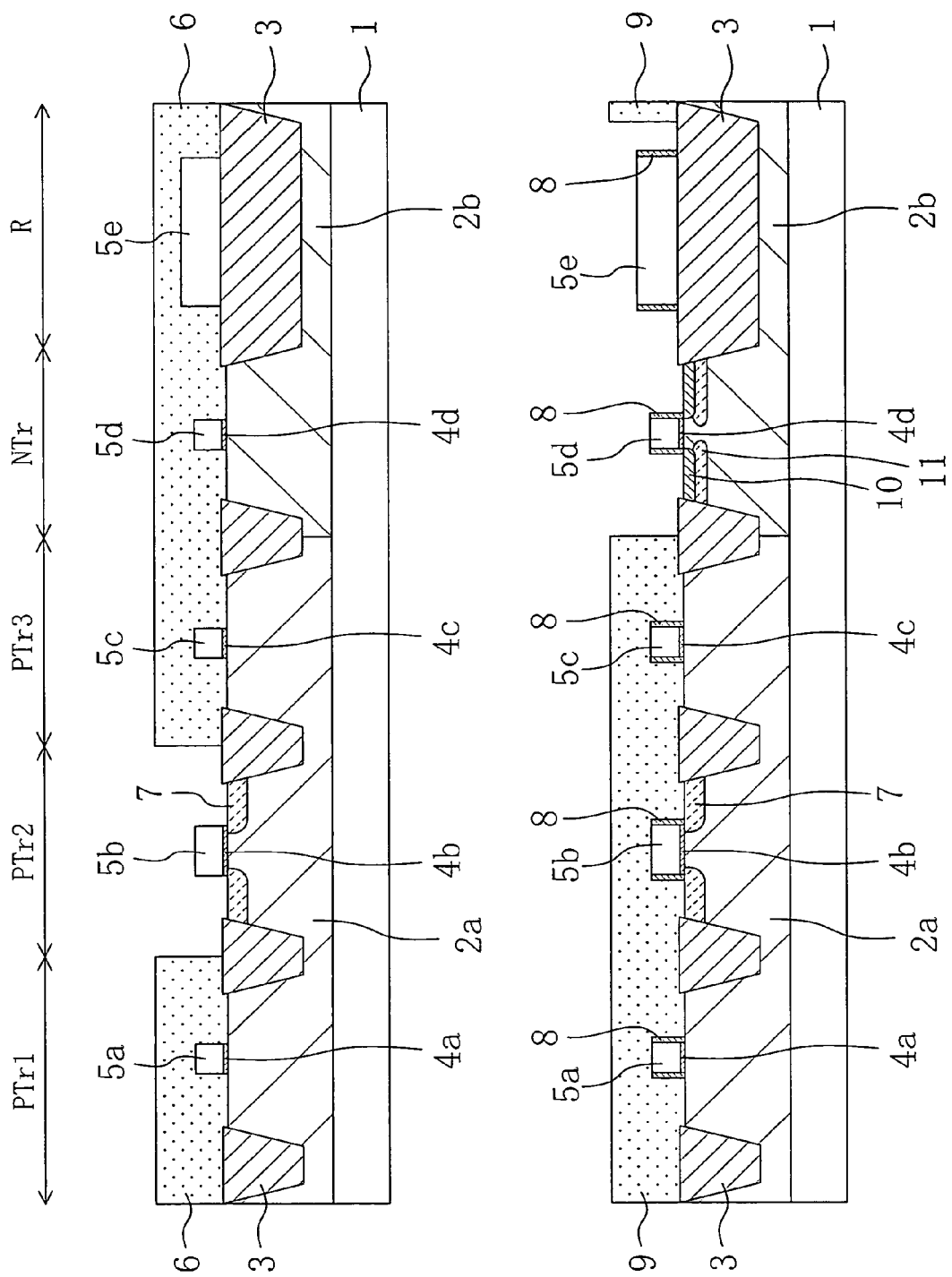

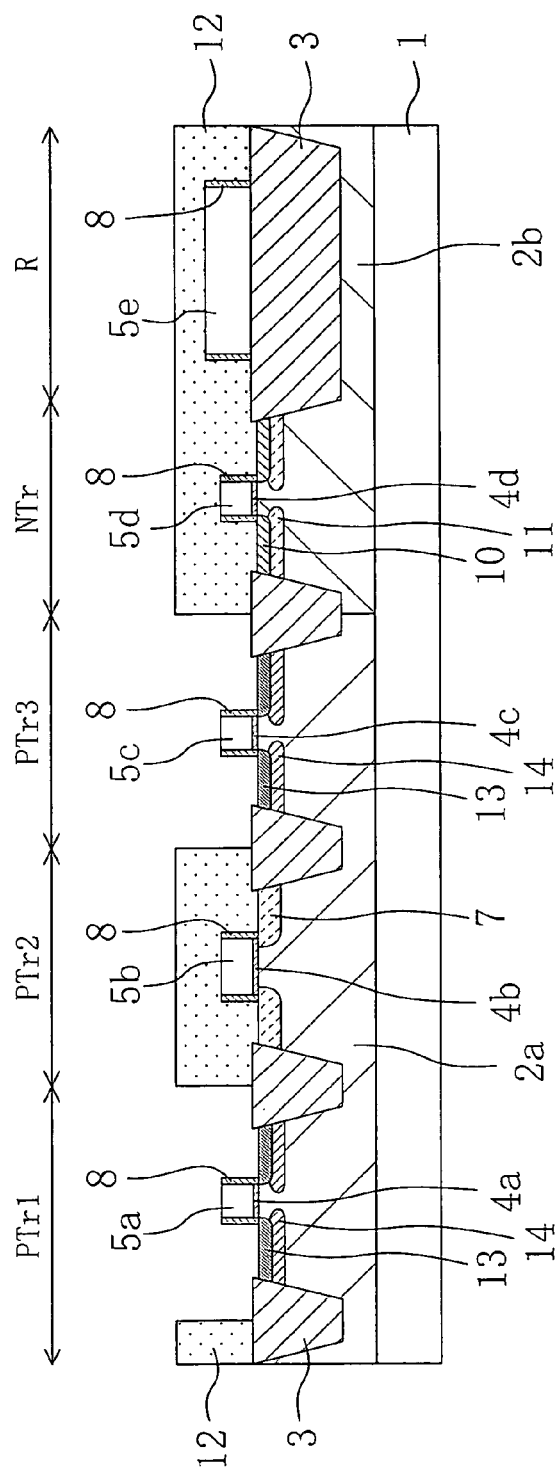
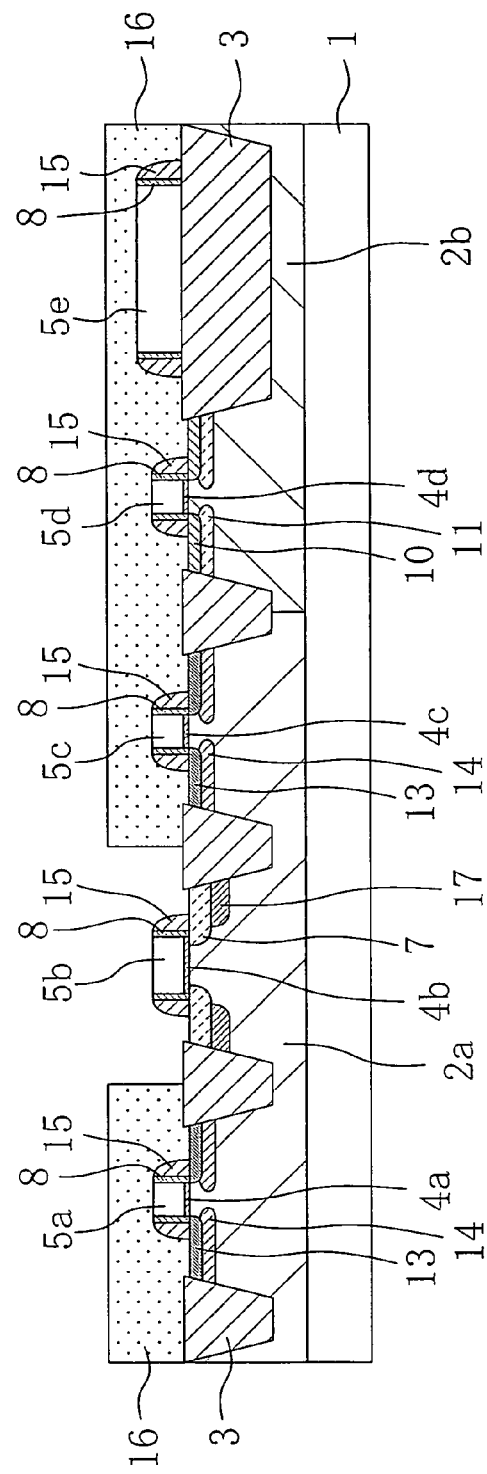
FIG. 3A
FIG. 3B

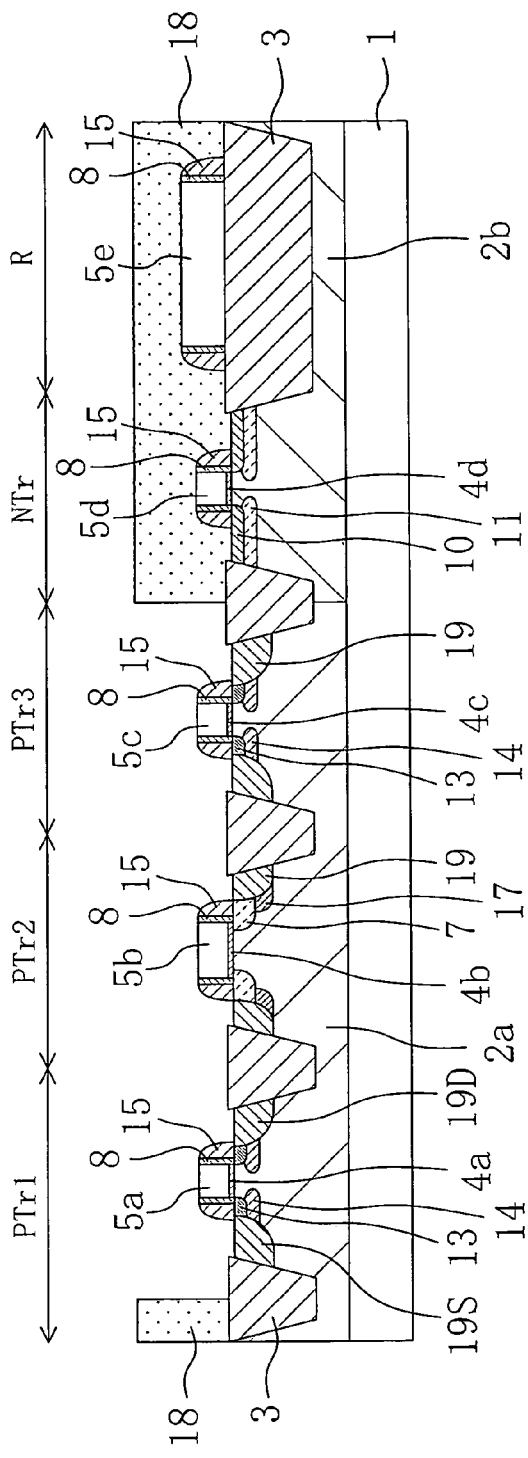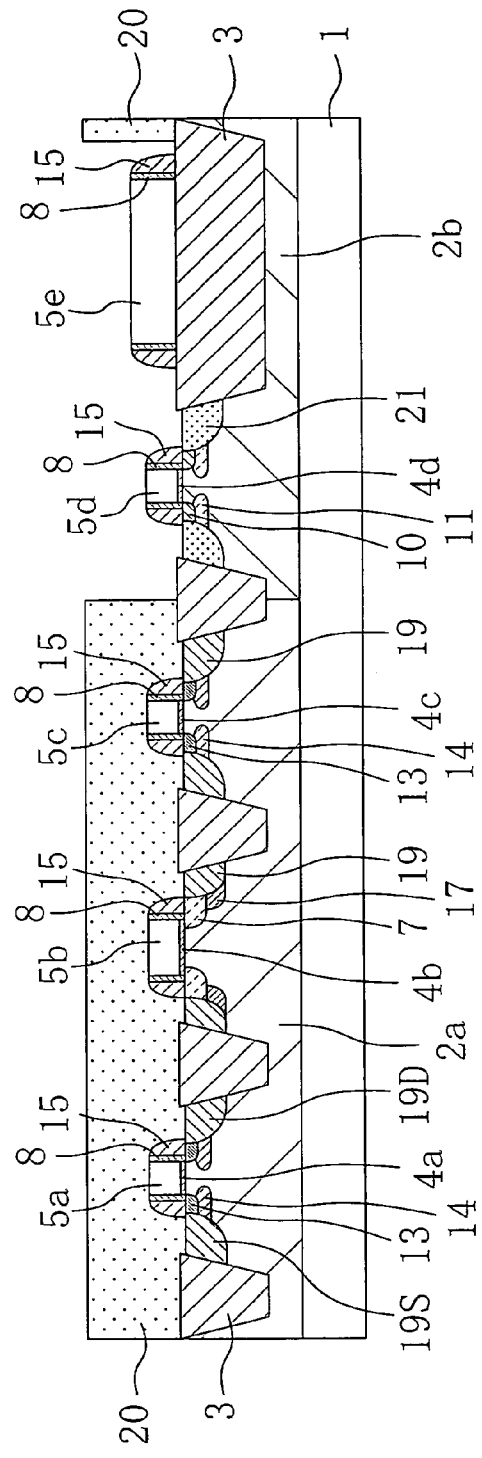
FIG. 4A
FIG. 4B

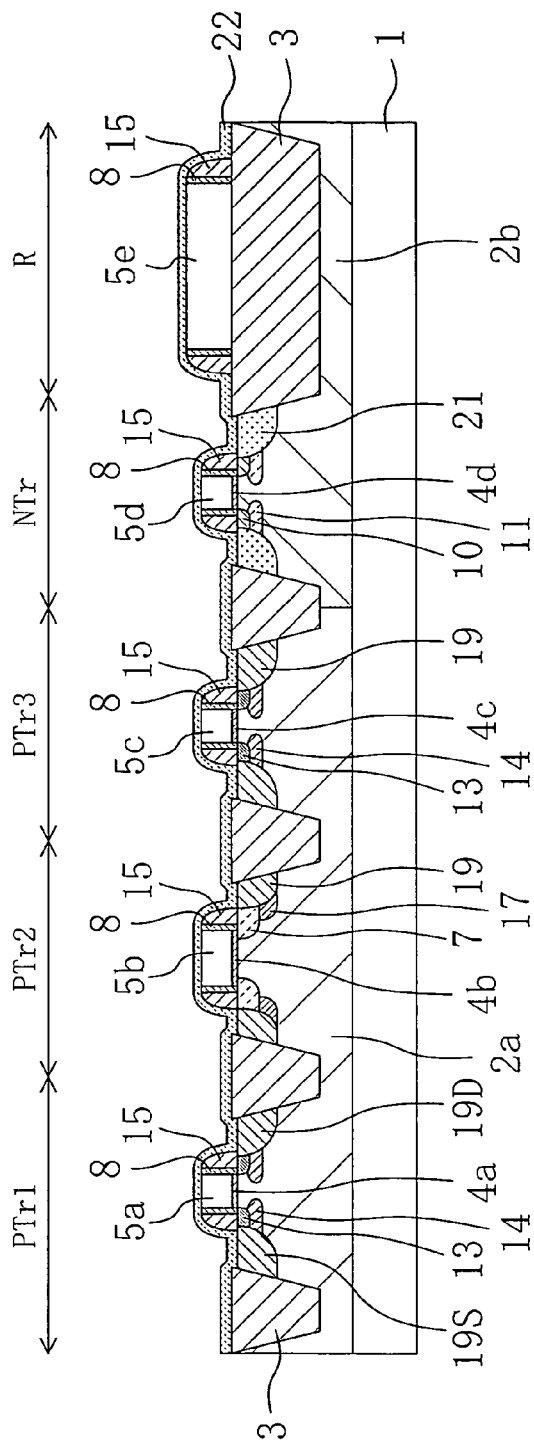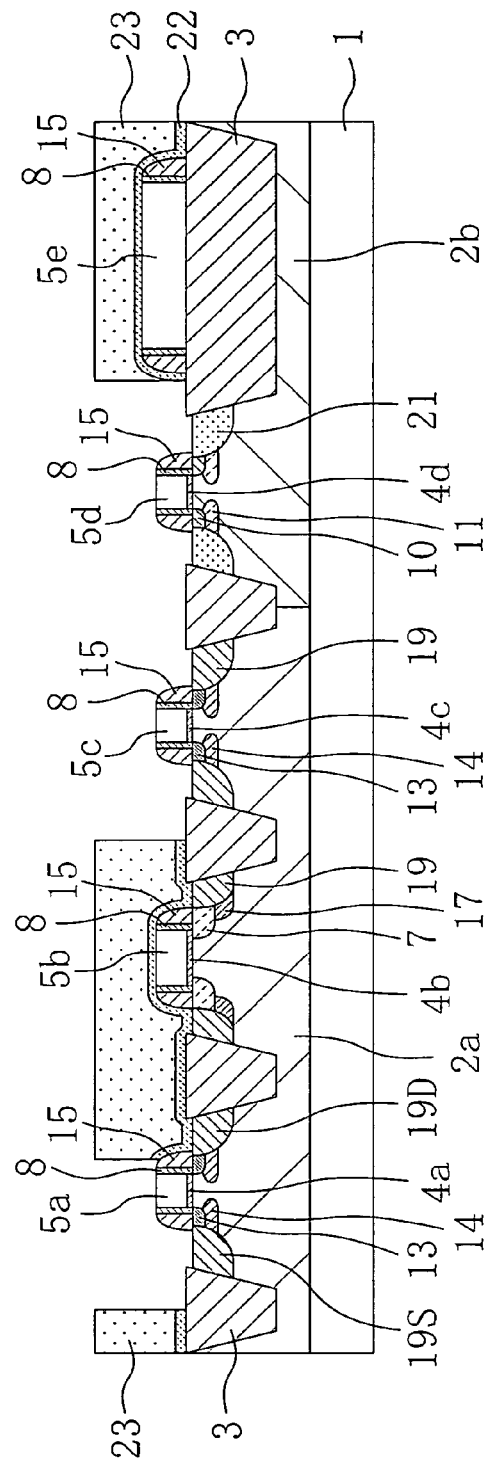
FIG. 5A
FIG. 5B

FIG. 7A
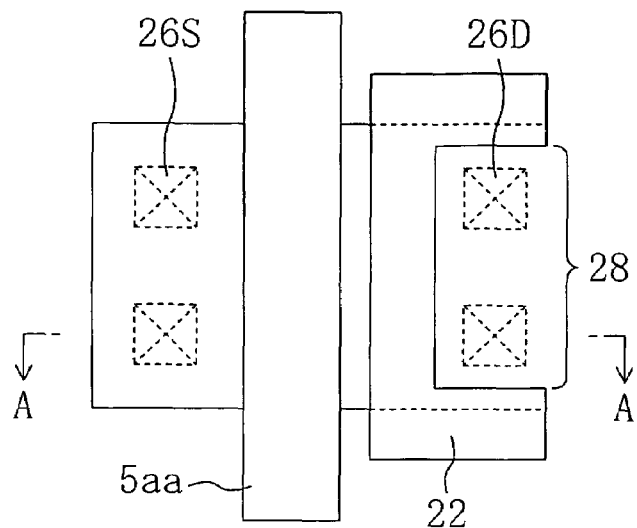
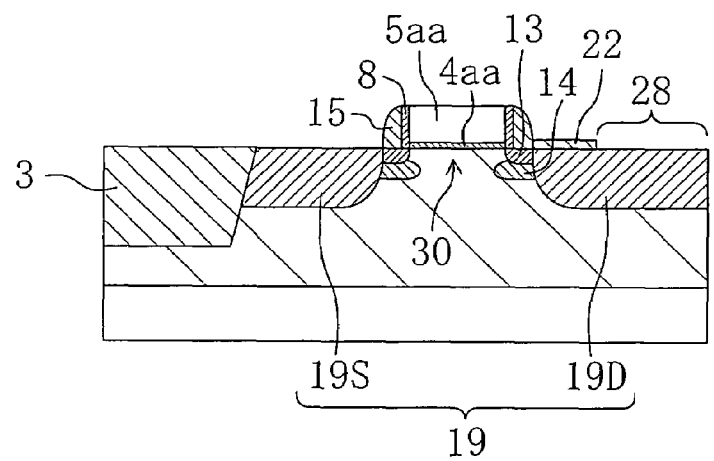
FIG. 7B
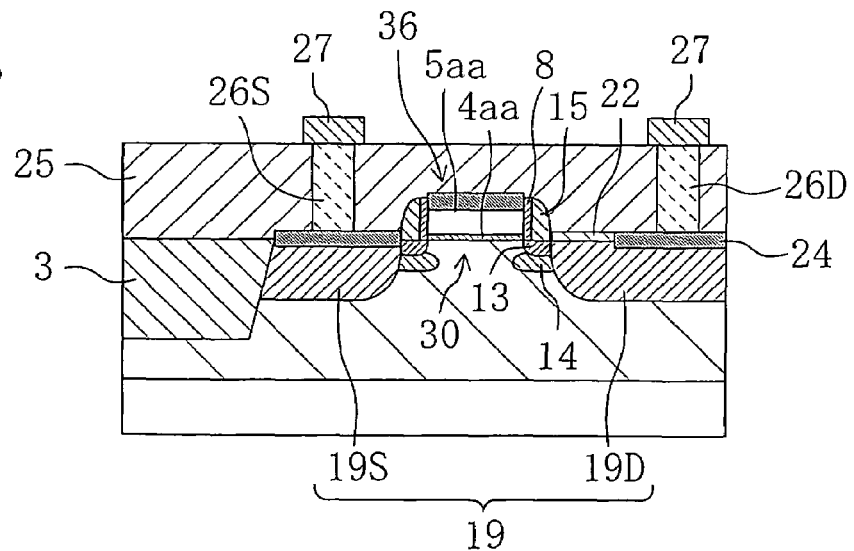

SEMICONDUCTOR DEVICE AND METHOD FOR FABRICATING THE SAME

CROSS-REFERENCE TO RELATED APPLICATION

This application claims priority under 35 U.S.C. §119(a) on Japanese Patent Application No. 2004-214611 filed on Jul. 22, 2004, the entire contents of which are hereby incorporated by reference.

BACKGROUND OF THE INVENTION

The present invention relates to a semiconductor device and a method for fabricating the same, and more particularly relates to a semiconductor device including a resistor and an MIS transistor and a method for fabricating the same.

An analog semiconductor device includes a resistor element formed of a resistive material, i.e., a polysilicon film, in addition to a CMIS transistor. In the analog semiconductor device, the CMIS transistor is required to be capable of operating at high speed and low power consumption. As for the resistor element, a resistor value thereof has to be controlled and stabilized (for example, see Japanese Laid-Open Publication No. 2003-152100).

In recent years, as the accuracy of resistors has been increased, fluctuation in the resistance value of a resistor due to auto-doping of an impurity during thermal treatment has become a serious problem. When a heavily impurity doped layer to be a source/drain regions of an MIS transistor is formed by ion implantation and then thermal treatment is performed to activate an impurity that has been ion-implanted, the impurity diffused outward from a surface of the doped region is diffused again in the resistor. This causes the fluctuation in the resistance value of a resistor. Now, a method which has been conventionally examined for the purpose of suppressing such a resistance value fluctuation will be described. FIGS. 8A through 8C are cross-sectional views illustrating respective steps for fabricating a semiconductor device including a NMIS transistor and a resistor in a conventional manner.

According to a known method for fabricating a semiconductor device, first, in the process step of FIG. 8A, a p-type well region 102 and a trench isolation 103 are formed in a semiconductor substrate 101. Thereafter, a gate insulation film 104 is formed on part of the semiconductor substrate 101 of which sides are surrounded by the isolation 103, i.e., an active region 100 and then a polysilicon film (not shown) is formed over the substrate. Thereafter, the polysilicon film is patterned so that a gate electrode 105a is formed on the gate insulation film 104 and also a resistor element 105b to serve as a resistor is formed on the isolation region 103. Then, using the gate electrode 105a as a mask, arsenic ions are implanted into the semiconductor substrate 101, thereby forming an n-type lightly doped layer 106. Subsequently, boron ions are implanted into the semiconductor substrate 101 using the gate electrode 105a as a mask, thereby forming a p-type pocket doped layer 107 in part of the semiconductor substrate 101 located under the n-type lightly doped layer 106.

Next, in the process step of FIG. 8B, a side wall 108 is formed on a side surface of the gate electrode 105a. At this time, the side wall 108 is also provided on a side surface of the resistor element 105b. Thereafter, arsenic ions are implanted into the semiconductor substrate 101 using the gate electrode 105a and the side wall 108 as a mask, thereby forming an n-type heavily doped layer 109.

Next, in the process step of FIG. 8C, an insulation film 110 is formed overt the substrate and then thermal treatment is performed to activate the impurity that has been ion-implanted.

According to the method described above, with the insulation film 110 having been formed, thermal treatment is performed to activate an impurity. Thus, auto-doping of the impurity from the n-type heavily doped layer 109 to the resistor element 105b can be prevented.

However, as in the known method, if with an upper surface of the substrate entirely covered with the insulation film 110, high temperature thermal treatment is performed to activate the impurity, breakdown of the gate insulation film 104 is caused. With reduction in the thickness of the gate insulation film 104, such breakdown of the gate insulation film 104 has become clearly noticeable.

On the other hand, when after the process step of FIG. 8B, thermal treatment for activating an impurity is performed without forming the insulation film 110, breakdown of the gate insulation film 104 is not caused. However, another problem arises, i.e., variation in the resistance value of the resistor due to auto-doping is caused.

SUMMARY OF THE INVENTION

It is an object of the present invention to provide a semiconductor device in which variations in a resistance value in a resistor element are suppressed and breakdown of a gate insulation film of an MIS transistor is prevented, and a method for fabricating the semiconductor device.

A semiconductor device according to the present invention is characterized in that the semiconductor device includes an MIS transistor including an isolation region surrounding sides of an active region of a semiconductor substrate, a gate insulation film provided on the active region, a gate electrode provided on the gate insulation film, and an impurity doped layer provided in part of the active region located under a side of the gate electrode; and a resistor including a resistor element provided on the isolation region and containing silicon and an insulation film covering at least part of the resistor element, and the insulation film is not provided on at least the gate electrode.

In a method for fabricating a semiconductor device having the structure described above, thermal treatment for activating an impurity doped layer can be performed with at least part of an upper surface of a resistor element covered with an insulation film and an upper surface of the gate electrode exposed. Because at least part of the resistor element is covered by the insulation film, in thermal treatment, variations in a resistance value due to auto-doping of the impurity in the impurity doped layer into the resistor element can be prevented. Also, unlike a known semiconductor device, the insulation film does not entirely cover an upper surface of the semiconductor substrate during thermal treatment. Thus, a stress applied to a gate insulation film can be reduced, compared to the known semiconductor device. Specifically, because the upper surface of the gate electrode is not covered by the insulation film and the like, breakdown of the gate insulation film can be prevented.

It is preferable that the insulation film covers upper and side surfaces of the resistor element. In such a case, auto-doping of the impurity can be reliably prevented.

It is preferable that a silicide film is provided on the gate electrode. In such a case, the insulation film can function as a film for preventing auto-doping of an impurity into the resistor in the step of thermal treatment for impurity activation. Also, in the step of silicidization, the insulation film can function as a mask for protecting a non-silicide region. Thus, fabrication process steps can be simplified.

The impurity doped layer may include source and drain regions and an insulation film may be provided on part of the drain region. In a method for fabricating a semiconductor device having this structure, if with an insulation film formed, silicidization is performed in the step of silicidization, a silicide film is not formed on part of the drain region in which the insulation film is not located. Thus, even when a large voltage is applied to a gate electrode of an MIS transistor, breakdown of the MIS transistor can be prevented. Note that the insulation film provided on the drain region is preferably formed in the same step of forming the insulation film located on a resistor element.

A method for fabricating a semiconductor device according to the present invention is characterized by including: the steps of a) forming an isolation region surrounding sides of an active region of a semiconductor substrate; b) forming, after the step a), a gate insulation film on the active region; c) forming, after the step b), a gate electrode on the gate insulation film; d) forming, after the step a), a resistor element including silicon on the isolation region; e) injecting, after the step c), an impurity into part of the active region located under a side of the gate electrode by ion implantation to form an impurity doped layer, f) forming, after the step d), an insulation film so as to cover at least an upper surface of part of the resistor element and not to cover an upper surface of the gate insulation film; and g) performing, after the step f), thermal treatment to activate the impurity in the impurity doped layer.

Thus, in the step g), at least part of a resistor element is covered by the insulation film. Thus, in thermal treatment, auto-doping of an impurity in an impurity doped layer into the resistor element can be prevented, so that a semiconductor device in which a resistance value is less varied can be obtained. Also, unlike the known method, an insulation film does not entirely cover an upper surface of a semiconductor substrate when thermal treatment is performed. Thus, a stress applied to a gate insulation film can be reduced, compared to the known semiconductor device. Specifically, because the upper surface of the gate electrode is not covered by the insulation film and the like, breakdown of the gate insulation film can be prevented. Therefore, a highly reliable semiconductor device can be obtained.

It is preferable that in the step f), upper and side surfaces are covered by the insulation film. In such a case, auto-doping of an impurity can be reliably prevented.

It is preferable that in the step f), after the insulation film has been formed over the upper surface of the semiconductor substrate, part of the insulation film located on the gate electrode is removed.

It is preferable that the method further includes the step of: after the step f), performing, with a metal film formed over the semiconductor substrate, thermal treatment to form a silicide film at least on the gate electrode. In such a case, the insulation film can function as a film for preventing auto-doping of an impurity into the resistor in the step of thermal treatment for impurity activation. Also, in the step of silicidization, the insulation film can function as a mask for protecting a non-silicide region. Thus, fabrication process steps can be simplified.

It is preferable that the impurity doped layer includes source and drain regions, and in the step f), part of the insulation film located in part of the drain region other than a contact formation region is left. In such a case, if with an insulation film formed, silicidization is performed in the step of silicidization, a silicide layer is not formed on part of the drain region in which the insulation film is located. Thus, even when a large voltage is applied to a gate electrode of an MIS transistor, breakdown of the MIS transistor can be prevented.

BRIEF DESCRIPTION OF THE DRAWINGS

FIGS. 2A and 2B are cross-sectional views illustrating respective steps for fabricating the semiconductor device according to the first embodiment of the present invention.

FIGS. 3A and 3B are cross-sectional views illustrating respective steps for fabricating the semiconductor device according to the first embodiment of the present invention.

FIGS. 4A and 4B are cross-sectional views illustrating respective steps for fabricating the semiconductor device according to the first embodiment of the present invention.

FIGS. 5A and 5B are cross-sectional views illustrating respective steps for fabricating the semiconductor device according to the first embodiment of the present invention.

FIGS. 7A and 7B are cross-sectional views illustrating respective steps for fabricating a semiconductor device according to a modified example of the first embodiment.

DESCRIPTION OF THE PREFERRED EMBODIMENTS

First Embodiment

Figure 1:
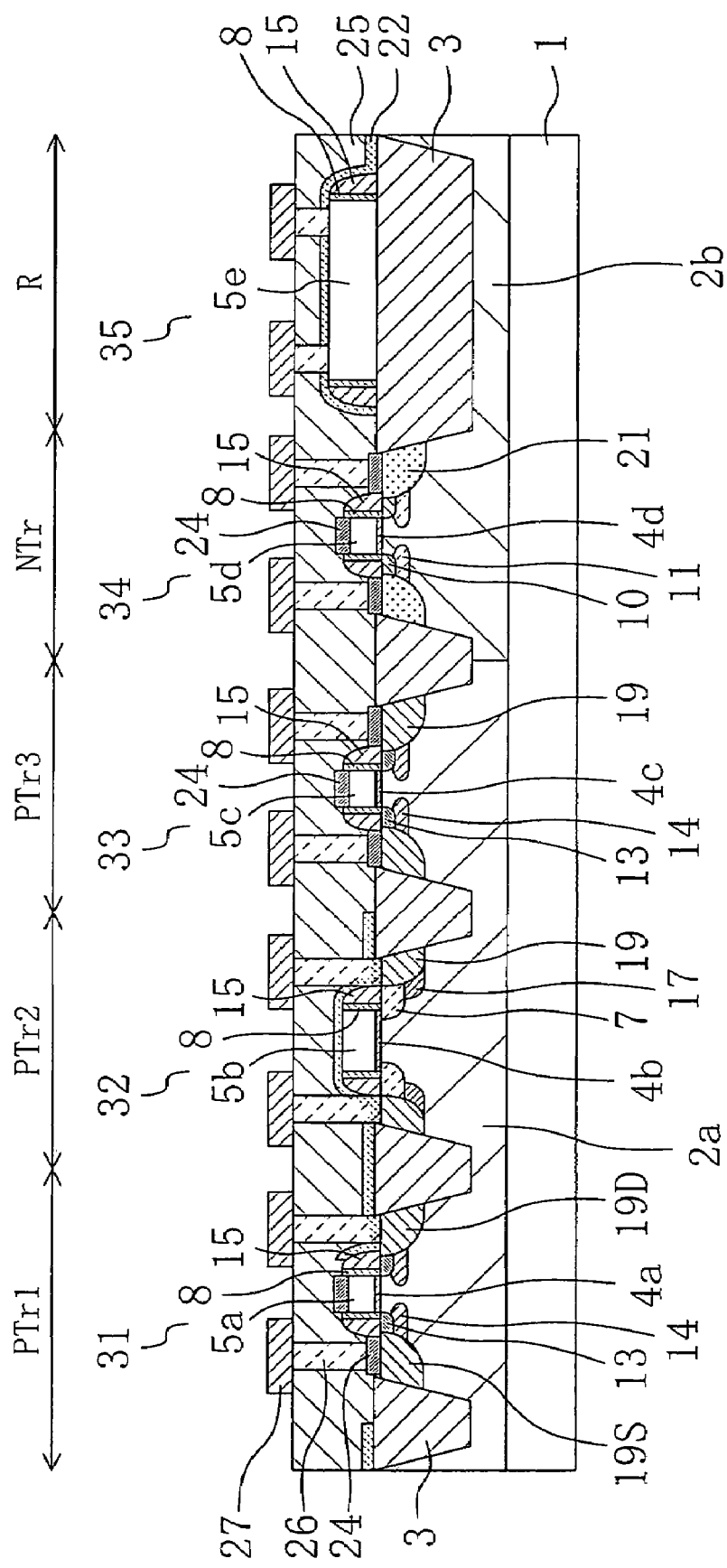
FIG. 1 is a cross-sectional view illustrating a structure of a semiconductor device according to a first embodiment of the present invention.

Hereinafter, a semiconductor device according to a first embodiment of the present invention and a method for fabricating the semiconductor device will be described with reference to the accompanying drawings. FIG. 1 is a cross-sectional view illustrating a structure of a semiconductor device according to the first embodiment of the present invention. In FIG. 1, a first PMIS transistor formation region (referred to as a "first PMIS region") PTr1, a second PMIS transistor formation region (referred to as a "second PMIS region") PTr2, a third PMIS transistor formation region (referred to as a "third PMIS region") PTr3, an NMIS transistor formation region (referred to as an NMIS region) Ntr, and a resistor formation region (referred to as a "register region") R are shown in this order from the left. In part of a semiconductor substrate 1 corresponding to each of the first PMIS region PTr1, the second PMIS region PTr2 and the third PMIS region PTr3, an n-type well region 2a is provided. In part of the semiconductor substrate 1 corresponding to each of the NMIS region NTr and the resistor region R, a p-type well region 2b is formed. An active region of each of the regions in the semiconductor substrate 1 is isolated by a shallow trench isolation region 3. Various combinations can be assumed for transistors provided in the transistor regions PTr1, PTr2, PTr3 and NTr. In this embodiment, the case where a transistor of an internal circuit protection circuit for the first PMIS region PTr1, a transistor of peripheral circuit protection circuit for the second PMIS region PTr2, a transistor of a logic circuit to be an internal circuit for each of the third PMIS region PTr3 and the NMIS region NTr are provided is taken as an example, and a transistor size, an impurity concentration and the like in each transistor will be described.

In the first PMIS region PTr1, a first PMIS transistor 31 is provided. The first PMIS transistor 31 includes a gate insulation film 4a provided on the semiconductor substrate 1 and having a relatively small thickness, a gate electrode 5a provided on the gate insulation film 4a, a first sidewall 8 provided on a side surface of the gate electrode 5a, a second sidewall 15 provided so as to cover the side surface of the gate electrode 5a with the first sidewall 8 interposed therebetween, a p-type lightly doped layer (referred to as a "p-type extension region" or a "p-type LDD region") 13 provided in part of the semiconductor substrate 1 located under a side of the gate electrode 5a, an n-type pocket doped layer 14 provided in part of the semiconductor substrate 1 located under the p-type lightly doped layer 13 so as to be in contact with the p-type lightly doped layer 13, and a p-type heavily doped source/drain region 19S/19D provided in part of the semiconductor substrate 1 located under a side of the second sidewall 15. In the first PMIS transistor 31, a silicide layer 24 is provided on each of the gate electrode 5a and the p-type heavily doped source region 19S but not on the p-type heavily doped drain region 19D.

In the second PMIS region PTr2, a second PMIS transistor 32 is provided. The second PMIS transistor 32 includes a gate insulation film 4b provided on the semiconductor substrate 1 and having a relatively large thickness, a gate electrode 5b provided on the gate insulation film 4b, a first sidewall 8 provided on a side surface of the gate electrode 5b, a second sidewall 15 provided so as to cover the side surface of the gate electrode 5b with the first sidewall 8 interposed therebetween, a p-type lightly doped layer (referred to as a "p-type extension region" or a "p-type LDD region") 7 provided in part of the semiconductor substrate 1 located under a side of the gate electrode 5b, a p-type very lightly doped layer 17 which is provided in part of the semiconductor substrate 1 located under the p-type lightly doped layer 7 so as to be in contact with the p-type lightly doped layer 7 and of which an impurity concentration is lower than that of the p-type lightly doped layer 7, and a p-type heavily doped layer (referred to as a "p-type heavily doped source/drain region") 19 provided in part of the semiconductor substrate 1 located under a side of the second sidewall 15. In the second PMIS transistor 32, a silicide layer is not provided on each of the gate electrode 5b and the p-type heavily doped layer 19 to serve as the source/drain region 19. Moreover, the p-type lightly doped layer 7 of the second PMIS transistor 32 has a lower impurity concentration than that of the p-type lightly doped layer 13 of the first PMIS transistor 31.

In the third PMIS region PTr3, a third PMIS transistor 33 is provided. The third PMIS transistor 33 includes a gate insulation film 4c provided on the semiconductor substrate 1 and having a relatively small thickness, a gate electrode 5c provided on the gate insulation film 4c, a first sidewall 8 provided on a side surface of the gate electrode 5c, a second sidewall 15 provided so as to cover the side surface of the gate electrode 5c with the first sidewall 8 interposed therebetween, a p-type lightly doped layer 13 provided in part of the semiconductor substrate 1 located under a side of the gate electrode 5c, an n-type pocket doped layer 14 provided in part of the semiconductor substrate 1 located under the p-type lightly doped layer 13 so as to be in contact with the p-type lightly doped layer 13, a p-type heavily doped layer (referred to as a "p-type heavily doped source/drain region") 19 provided in part of the semiconductor substrate 1 located under a side of the second sidewall 15, and a cobalt silicide film 24 provided on each of the gate electrode 5c and the p-type heavily doped layer 19 to serve as a source/drain region.

In the NMIS region NTr, an NMIS transistor 34 is provided. The NMIS transistor 34 includes a gate insulation film 4d provided on the semiconductor substrate 1 and having a relatively small thickness, a gate electrode 5d provided on the gate insulation film 4d, a first sidewall 8 provided on a side surface of the gate electrode 5d, a second sidewall 15 provided so as to cover the side surface of the gate electrode 5d with the first sidewall 8 interposed therebetween, an n-type lightly doped layer (referred to as an "n-type extension region" or an "n-type LDD region") 10 provided in part of the semiconductor substrate 1 located under a side of the gate electrode 5d, a p-type pocket doped layer 11 provided in part of the semiconductor substrate 1 located under the n-type lightly doped layer 10 so as to be in contact with the n-type lightly doped layer 10, an n-type heavily doped layer (referred to as an "n-type heavily doped source/drain region") 21 provided in part of the semiconductor substrate 1 located under a side of the second sidewall 15, and a cobalt suicide film 24 provided on each of the gate electrode 5d and the n-type heavily doped layer 21 to serve as a source/drain region.

In the resistor region R, a resistor element 5e located on the isolation region 3, a first sidewall 8 located on a side surface of the resistor element 5e, a second sidewall 15 located so as to cover the side surface of the resistor element 5e with the first sidewall 8 interposed therebetween are provided. In the resistor region R, a silicide layer is not provided on the resistor element 5e.

The drain region 19D of the first PMIS region PTr1, the gate electrode 5b of the second PMIS region PTr2, the resistor element 5e in the resistor region R on which silicide is not provided are covered by a silicon oxide film 22. Furthermore, an interlevel insulation film 25 is provided over the semiconductor substrate 1 so as to cover the gate electrodes 5a through 5d and the resistor element 5e. A contact plug 26 is provided so as to pass through the interlevel insulation film 25 and reach each of the doped layer or the cobalt silicide film and an interconnect layer 27 is provided on the interlevel insulation film 25 so as to be in contact with the contact plug 26.

Next, a method for fabricating the semiconductor device of this embodiment will be described with reference to the accompanying drawings. FIGS. 2A and 2B and FIGS. 3 through 6 are cross-sectional views illustrating respective steps for fabricating a semiconductor device according to the first embodiment of the present invention.

In the method for fabricating a semiconductor device according to this embodiment, first in the step of FIG. 2A, an n-type well region 2a and a p-type well region 2b are defined in a semiconductor substrate 1, and then part of the semiconductor substrate 1 is removed and filled with an insulation film, thereby forming a shallow trench isolation region (referred to as an "STI isolation region") 3. Thereafter, gate insulation films 4a, 4c and 4d are simultaneously formed on respective active regions in a first PMIS region PTr1, a third PMIS region PTr3 and an NMIS region NTr so that each of the gate insulation films 4a, 4c and 4d has a thickness of 2 nm. Moreover, a gate insulation film 4b is formed on an active region made of part of the semiconductor substrate 1 in a second PMIS region PRr2 so as to have a thickness of 7 nm. As for the gate insulation film 4b having a larger thickness than that of the gate insulation films 4a, 4b and 4d, part of the gate insulation film 4b may be formed simultaneously with the gate insulation films 4a, 4b and 4c and rest part thereof may be separately formed, or the whole part of the gate insulation film 4b may be formed in separate process steps from the steps of forming the gate insulation films 4a, 4c and 4d. Thereafter, a polysilicon film (not shown) is formed over the substrate so as to have a thickness of 200 mm, and then, the polysilicon film is patterned using photolithography and dry-etching. Thus, the gate electrode 5a is formed on the gate insulation film 4a in the first PMIS region PTr1, the gate electrode 5b is formed on the gate insulation film 4b in the second PMIS region PTr2, the gate electrode 5c is formed on the gate insulation film 4c in the third PMIS region PTr3, the gate electrode 5d is firmed on the gate insulation film in the NMIS region NTr and a resistor element 5e is formed on the isolation region in a resistor region R. Thereafter, a resist 6 is formed so as to have an opening corresponding to the second PMIS region PTr2 and cover the first PMIS region PTr1, the third PMIS region PTr3, the NMIS region NTr and the resistor region R. In the state described above, using the gate electrode 5b and the resist 6 as a mask, ion implantation of $BF_2$ ions serving as a p-type impurity into an active region of the second PMIS region PTr2 is performed four times during a single rotation at an acceleration energy of 45 KeV and a dose of $1.2 \times 10^{12}$ ions/cm$^2$ and with a tilt angle of 7 degrees. Thus, the p-type lightly doped layer 7 is formed.

Next, in the step of FIG. 2B, the resist 6 is removed, and then, a silicon oxide film (not shown) is formed over the substrate so as to have a thickness of 13 nm. The silicon oxide film is etched back to form a first sidewall 8 used for location adjustment on a side surface of each of the gate electrodes 5a, 5b, 5c and 5d and the resistor element 5e. Thereafter, a resist 9 is formed over the semiconductor substrate 1 so as to have an opening corresponding to each of the NMIS region NTr and the resistor region R and cover the first PMIS region PTr1, the second PMIS region PTr2 and the third PMIS region PTr3. Then, using the gate electrode 5d, the first sidewall 8 and the resist 9 as a mask, implantation of arsenic ions serving as an n-type impurity into an active region of the NMIS region NTr is conducted four times during a single rotation at an acceleration energy of 5 KeV and a dose of $2.0 \times 10^{14}$ ions/cm$^2$ and with a tilt angle of 0 degrees. Thus, the n-type lightly doped layer 10 is formed. Subsequently, using the first sidewall 8 and the resist 9 as a mask, ion implantation of boron ions serving as a p-type impurity into an active region of the NMIS region NTr is conducted four times during a single rotation at an acceleration energy of 12 KeV and a dose of $7.0 \times 10^{12}$ ions/cm$^2$ and with a tilt angle of 25 degrees. Thus, a p-type pocket doped layer 11 is formed. In this step, arsenic ions and boron ions are also implanted into the resistor element 5e. However, the resistor element 5e becomes the n-type because the dose of arsenic ions is an order magnitude greater than the dose of the boron ions.

Next, in the step of FIG. 3A, the resist 9 is removed, and then, a resist 12 is formed so as to have an opening corresponding to each of the first PMIS region PTr1 and the third PMIS region PTr3 and cover the second PMIS region PTr2 and the NMIS region NTr. Thereafter, using the gate electrodes 5a and 5c and the first sidewall 8 and the resist 12 as a mask, ion implantation of boron ions serving as a p-type impurity into each of respective active regions of the first PMIS region PTr1 and the third PMIS region PTr3 is conducted four times during a single rotation at an acceleration energy of 0.7 KeV and a dose of $1.8 \times 10^{14}$ ions/cm$^2$ and with a tilt angle of 0 degrees. Thus, p-type doped layer 13 is formed. Subsequently, using the gate electrodes 5a and 5c and the first sidewall 8 and the resist 12 as a mask, ion implantation of arsenic ions serving as an n-type impurity into each of active regions of the first PMIS region PTr1 and the third PMIS region PTr3 is conducted four times during a single rotation at an acceleration energy of 70 KeV and a dose of $7.0 \times 10^{12}$ ions/cm$^2$ and with a tilt angle of 25 degrees. Thus, an n-type pocket doped layer 14 is formed.

Next, in the step of FIG. 3B, the resist 12 is removed, and then, a silicon nitride oxide film (not shown) is formed over the substrate so as to have a thickness of 60 nm. Thereafter, the silicon nitride film is etched back, thereby forming a second sidewall 15 on a side surface of each of the gate electrodes 5a, 5b, 5c and 5d and the resistor element 5e with the first sidewall 8 interposed therebetween. Then, a resist 16 is formed over the substrate so as to have an opening corresponding to the second PMIS region PTr2 and cover the first PMIS region PTr1, the third PMIS region PTr3, the NMIS region NTr and the resistor region R. Thereafter, using the gate electrode 5b, the first sidewall 8, the second sidewall 15 and the resist 16 as a mask, ion implantation of boron ions serving as a p-type impurity into an active region of the second PMIS region PTr2 is conducted four times during a single rotation at an acceleration energy of 15 KeV and a dose of $7.5 \times 10^{12}$ ions/cm$^2$ and with a tilt angle of 7 degrees. Thus, a p-type very lightly doped layer 17 is formed.

Next, in the step of FIG. 4A, the resist 16 is removed, and then, a resist 18 is formed over the semiconductor substrate 1 so as to have an opening corresponding to each of the first PMIS region PTr1, the second PMIS region PTr2, and the third PMIS region PTr3 and cover the NMIS region NTr and the resistor region R. Thereafter, using the gate electrodes 5a, 5b and 5c, the first sidewall 8 and the second sidewall 15 as a mask, ion implantation of boron ions serving as a p-type impurity into each of active regions of the first PMIS region PTr1, the second PMIS region PTr2, and the third PMIS region PTr3 is conducted four times during a single rotation at an acceleration energy of 3 KeV and a dose of $3.6 \times 10^{15}$ ions/cm$^2$ and with a tilt angle of 7 degrees. Thus, a p-type heavily doped layer (referred to as a "p-type heavily doped source/drain region) 19 is formed in each region.

Next, in the step of FIG. 4B, the resist 18 is removed, and then, a resist 20 is formed over the substrate so as to have an opening corresponding to each of the NMIS region NTr and the resistor region R and cover the first PMIS region PTr1, the second PMIS region PTr2 and the third PMIS region PTr3. Thereafter, using the gate electrode 5d, the first sidewall 8, the second sidewall 15 and the resist 20 as a mask, ion implantation of arsenic ions serving as an n-type impurity into an active region of the NMIS region NTr is conducted at an acceleration energy of 20 KeV and a dose of $3.0 \times 10^{14}$ ions/cm$^2$ and with a tilt angle of 7 degrees. Subsequently, ion implantation of arsenic ions serving as an n-type impurity into the active region of the NMIS region NTr are conducted four times during a single rotation at an acceleration energy of 50 KeV and a dose of $1.25 \times 10^{15}$ ions/cm$^2$ and with a tilt angle of 7 degrees. Furthermore, ion implantation of phosphorus ions serving as an n-type impurity into the active region of the NMIS region NTr is conducted at an acceleration energy of 40 KeV and a dose of $2.5 \times 10^{12}$ ions/cm$^2$ and with a tilt angle of 7 degrees. Thus, an n-type heavily doped layer (referred to as an "n-type source/drain region) 21 is formed.

Next, in the step of FIG. 5A, the resist 20 is removed, and then, a silicon oxide film 22 is formed over the semiconductor substrate 1 using CVD at a deposition temperature of 450° C. so as to have a thickness of 50 nm and not to contain an impurity.

Next, in the step of FIG. 5B, a resist 23 is formed over the silicon oxide film 22 so as to have an opening corresponding to each of part of the first PMIS region PTr1 extending from the gate electrode 5a to the source region 19S and a suicide formation region including the third PMIS region PTr3 and the NMIS region NTr and cover a non-silicide-formation region including the drain region 19D of the first PMIS region PTr1, the second PMIS region PTr2 and the resistor formation region R. Thereafter, using the resist 23 as a mask, part of the silicon oxide film 22 located in the silicide formation region is selectively etched by wet etching. Thus, the non silicide formation region is covered by the silicon oxide film 22 and the gate electrodes 5a, 5c and 5d in the silicide formation region, the source region 19S in the first PMIS region PTr1, the p-type heavily doped layer 19 in the third PMIS region PTr3 and the n-type heavily doped layer 21 of the NMIS region NTr are exposed.

Figure 6:
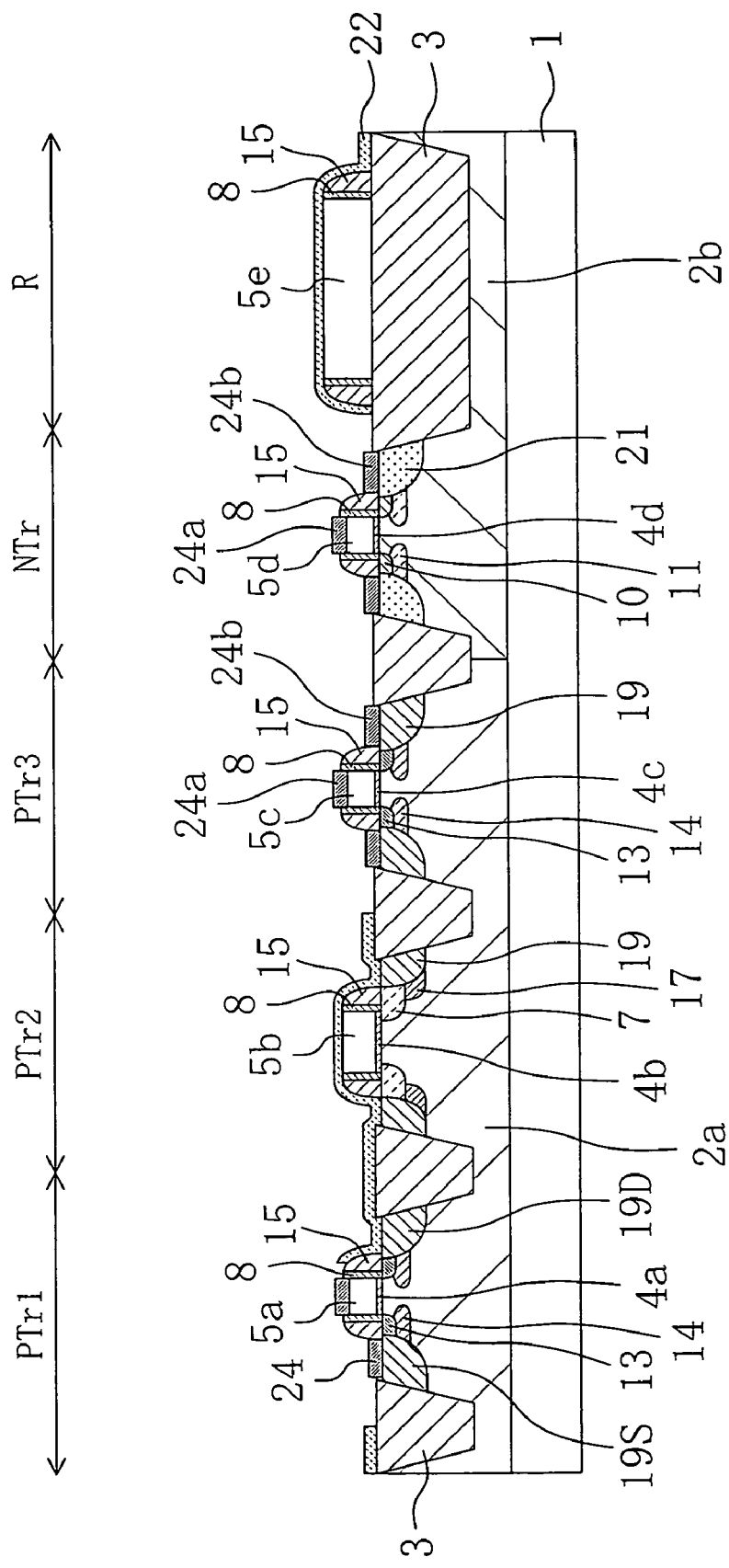
FIG. 6 is a cross-sectional view illustrating respective steps for fabricating the semiconductor device according to the first embodiment of the present invention.
Figure 8A:
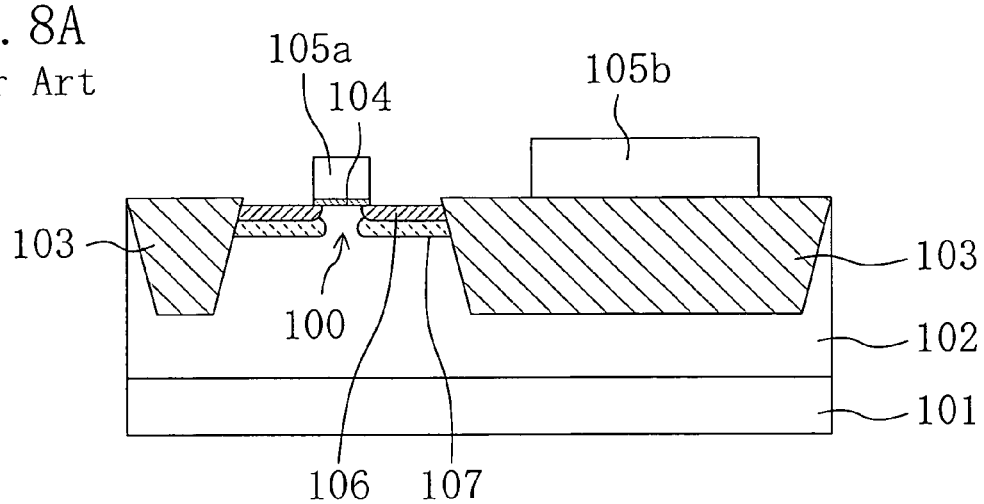
FIGS. 8A, 8B and 8C are cross-sectional views illustrating respective steps of a fabrication method for fabricating a semiconductor device including an NMIS transistor and a resistor.
Figure 8B:
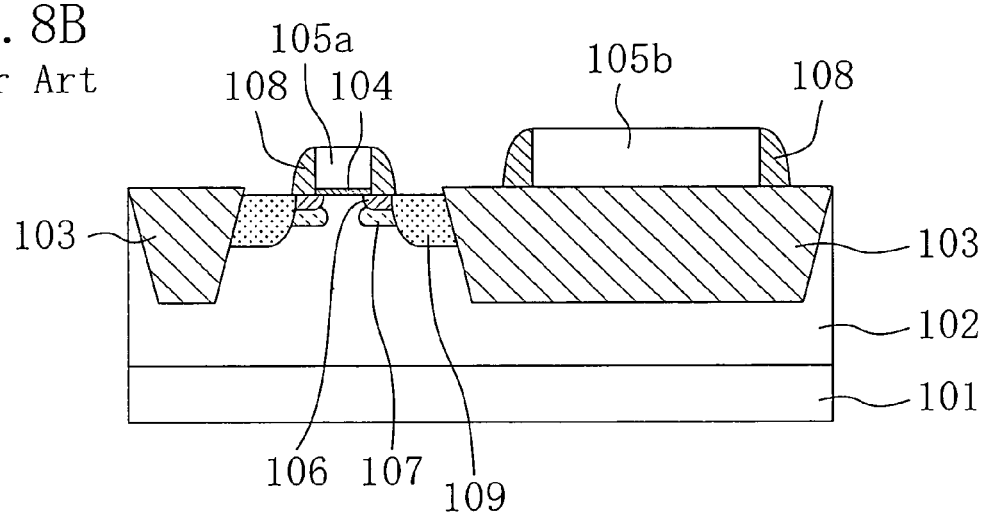
Figure 8C:
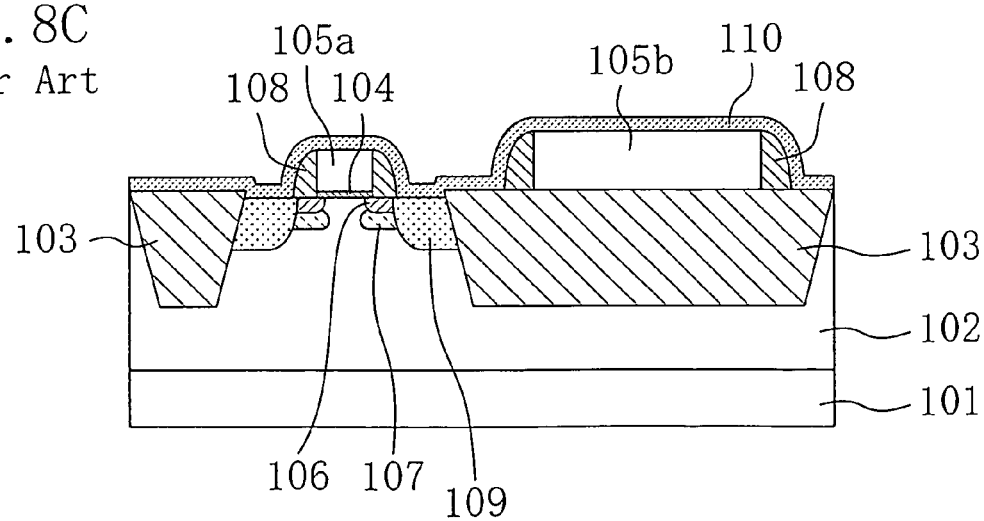

Next, in the step of FIG. 6, the resist 23 is removed, and then, rapid thermal annealing (RTA) is performed at a temperature of 1030° C. for 10 seconds to activate the impurities in each doped layer.

Thereafter, a cobalt film (not shown) is formed over the substrate so as to have a thickness of 9 nm, and then, first thermal annealing (RTA) is performed in a nitrogen atmosphere at 470° C. for 60 seconds to bring the gate electrodes 5a, 5c and 5d into reaction with cobalt and also bring silicon exposed in the source region 19S in the first PMIS region PTr1, the p-type heavily doped layer 19 in the third PMIS region PTr3 and the n-type heavily doped layer 21 in the NMIS region NTr into reaction with cobalt. Thus, a cobalt silicide film (not shown) is formed. Thereafter, an unreacted residue of the cobalt film left on the silicon oxide film 22, the isolation region 3 and like regions are selectively removed by a mixed solution including hydrochloric acid and a hydrogen peroxide solution. Thereafter, second thermal treatment (RTA) is performed in an nitrogen atmosphere at 750° C. for 60 seconds, thereby forming a cobalt silicide film 24 on each of the gate electrodes 5a, 5c and 5d, the source region 19S in the first PMIS region PTr1, the p-type heavily doped region 19 in the third PMIS region PTr3 and the n-type heavily doped layer 21 in the NMIS region NTr.

Thereafter, an interlevel insulation film 25 (shown in FIG. 1) is formed over the semiconductor substrate 1. Then, a contact hole (not shown) is formed in the interlevel insulation film 25 so as to reach the p-type heavily doped layer 19 of each of the MIS transistors 31 through 34, the silicide layer 24 or the resistor element 5e of the resistor 35 and a metal film is filled in the contact hole, thereby forming a contact plug 26 (shown in FIG. 1). Thereafter, an interconnect layer 27 (shown in FIG. 1) connected to each contact plugs 26 is formed on the interlevel insulation film 25. With this step, respective steps for fabricating the semiconductor device of this embodiment are completed.

According to this embodiment, in the step of FIG. 6, thermal annealing is performed to activate the impurities with the upper surface of the resistor element 5e covered by the silicon oxide film 22. Thus, auto-doping of the impurity contained in each impurity doped region into the resistor element 5e can be prevented. Moreover, unlike the known semiconductor device, the semiconductor substrate 1 is not entirely covered by the silicon oxide film 22, so that a stress given to the semiconductor substrate 1 from the silicon oxide film 22 is reduced. Specifically, an insulation film is not provided on the gate electrodes 5a, 5c and 5d. Accordingly, a stress given to the gate insulation films 4a, 4c and 4d from the gate electrodes 5a, 5c and 5d is reduced, so that breakdown of the gate insulation films 4a, 4c and 4d each having a small thickness, which is to occur in a known manner, can be prevented.

In this embodiment, the case where the first PMIS transistor 31 is a transistor of an internal circuit protection circuit and the second PMIS transistor 32 is a transistor of a peripheral circuit protection circuit has been described as an example. In general, transistors of an internal circuit protection circuit and a peripheral circuit protection circuit are not silicidized but transistors of an internal circuit and a peripheral circuit are silicidized. In the description above, an upper surface of the second PMIS transistor 32, i.e., the non-silicide region, is entirely covered by the silicon oxide film 22 so as not to be silicidized. In contrast, an upper surface of the gate electrode 5a of the first PMIS transistor 31, i.e., the non-silicide region is also silicidized. The reason for this is as follows.

In general, an internal circuit protection circuit is provided for the purpose of protecting an internal circuit from an external surge. Thus, a large voltage is suddenly applied to the gate of a transistor in an internal circuit protection circuit. Assume that a silicide layer is formed on the drain region 19D in the first PMIS transistor 31 of the internal circuit protection circuit. When a large voltage is applied to the gate electrode 5a, breakdown of the transistor is caused. To prevent this inconvenience, it is necessary not to provide a silicide layer on the drain region 19D and, therefore, in the step of silicidization, the drain region 19D is covered by the silicon oxide film 22. That is, also in thermal treatment performed before the step of silicidization, an upper surface of the drain region 19D is covered by the silicon oxide film 22. On the other hand, however, if thermal treatment is performed with the gate electrode 5a covered by the silicon oxide film or the like, breakdown of the gate insulation film might be caused. To prevent the breakdown of the gate insulation film, in thermal treatment, the gate electrode 5a is exposed and part of the p-type heavily doped impurity active layer 19 located in the drain region 19D is covered by the silicon oxide film 22. This will be later described in detail in a modified example of the first embodiment.

On the other hand, a gate insulation film of a transistor of a peripheral circuit protection circuit has a larger thickness than that of a gate insulation film of a transistor of some other circuit such as an internal circuit and an internal circuit protection circuit. Accordingly, even if thermal treatment is performed with the gate electrode 5b of the second PMIS transistor 32 covered by the silicon oxide film 22, breakdown of the gate insulation film 4b hardly occurs. For the reasons described above, the upper surface of the second PMIS transistor 32 is entirely covered by the silicon oxide film 22.

Note that in this embodiment, the interlevel insulation film 25 is formed with a residue of the silicon oxide film left. However, the silicon oxide film 22 may be selectively removed after the cobalt silicide film 24 has been formed.

Modified Example of First Embodiment

Hereinafter, a modified embodiment of the first embodiment will be described with reference to the accompanying drawings. In the first embodiment, the transistors PTr1, PTr2, PTr3 and NTr are provided. In this modified example, the case where a single transistor and a resistor are provided will be described. Note that the structure of the resistor is the same as that of the first embodiment and therefore the illustration and description thereof will be omitted.

According to fabrication process steps according to this modified example, in the same process steps as those of FIGS. 2A through 5A in the first embodiment, a gate insulation film 4aa and a gate electrode 5aa are formed on the active region 30 surrounded by the isolation region 3 shown in FIG. 7A, and then, a p-type lightly doped layer 13, an n-type pocket doped layer 14, a first sidewall 8, a second sidewall 15 and a p-type heavily doped layer 19 are formed in this order. In FIG. 7A, of parts of the p-type heavily doped layer 19 located under both sides of the gate electrode 5aa, respectively, one in the right-hand is a heavily doped drain region 19D and the other one on the left-hand side, i.e., a doped layer located between the isolation region 3 and the gate electrode 5aa is a heavily doped source region 19S. Thereafter, as in the step of FIG. 5A, a silicon oxide film 22 is formed over the substrate.

Next, in the same manner as that of FIG. 5B, a resist (not shown) is formed so as to cover the heavily doped drain region 19D. In the resist formed here, an opening is formed in advance so that part of the heavily doped drain region 19D, i.e., a drain contact formation region 28 is exposed therethrough. The drain contact formation region 28 is to be brought into contact with the drain contact 26D (shown in FIG. 7B) later. In this state, the silicon oxide film 22 is etched using the resist as a mask, so that parts of the silicon oxide film 22 located on the gate electrode 5aa, the heavily doped source region 19S and the drain contact formation region 28 are removed and the silicon oxide film 22 is left in part of the heavily drain region 19D located other than a region thereof in contact with the drain contact 26D. Thereafter, rapid thermal annealing (RTA) is performed at a temperature of 1030° C. for 10 seconds to activate an impurity in each doped layer.

Thereafter, as shown in FIG. 7B, in the same manner as in the first embodiment, a cobalt silicide film 24, an interlevel insulation film 25, a source contact plug 26S, a drain contact plug 26D and an interconnect layer 27 are formed in this order, thereby obtaining a PMIS transistor 36.

In this modified example, with the upper surface of the gate electrode 5aa exposed and the part of the heavily doped drain region 19D located other than the drain contact formation region 28 covered by the silicon oxide film, thermal treatment and silicidization are performed. Thus, it is possible to prevent breakdown of the gate insulation film 4aa. Furthermore, an upper surface of part of the heavily doped drain region 19D covered by the silicon oxide film 22 is not silicidized. Therefore, breakdown of a transistor caused when a large voltage is applied to the gate electrode 5aa can be prevented.

What is claimed is:

1. A semiconductor device comprising:
a first MIS transistor including an isolation region surrounding sides of a first active region of a semiconductor substrate, a first gate insulation film provided on the first active region, a first gate electrode provided on the first gate insulation film, a first impurity doped layer provided in part of the first active region located under a side of the first gate electrode, a first silicide film provided on the first gate electrode, a second silicide film provided on the first impurity doped layer, and a first contact plug directly connected to the second silicide film; and
a resistor including a resistor element provided on the isolation region and containing silicon, a first sidewall provided on a side surface of the resistor element, a second sidewall provided over the side surface of the resistor element with the first sidewall interposed therebetween, an insulation film covering part of the resistor element and the first and second sidewalls, and a second contact plug directly connected to the resistor element,
wherein the insulation film is not provided on the first gate electrode,
the silicide film is not provided between the resistor element and the second contact plug, and
the first impurity doped layer includes source and drain regions and the insulation film is provided on part of the drain region and the second silicide layer is not provided on the part of the drain region.

2. The semiconductor device of claim 1, wherein the insulation film covers upper and side surfaces of the resistor element.

3. The semiconductor device of claim 1,
wherein the first MIS transistor comprises:
the first sidewall provided on a side surface of the first gate electrode,
the second sidewall provided on so as to cover the side surface of the first gate electrode, with the first sidewall interposed therebetween,
a first lightly doped layer of a first conductivity type provided in part of the first active region located under a side of the gate electrode,
a first pocket doped layer of a second conductivity type provided in part of the first active region located under the first lightly doped layer so as to be in contact with the first lightly doped layer;
the first impurity doped layer having a first heavily doped layer of the first conductivity type provided in part of the first active region located under a side of the second sidewall to serve as a source/drain region; and
the second silicide film provided on at least the source region included in the first heavily doped layer.

4. The semiconductor device of claim 3, wherein
the first MIS transistor is a NMIS transistor,
the first conductivity type is N-type and the second conductivity type is P-type, and
the second silicide film is provided on the contact formation region of the drain region included in the first heavily doped layer.

5. The semiconductor device of claim 3, wherein
the first MIS transistor is a PMIS transistor,
the first conductivity type is P-type and the second conductivity type is N-type, and
the second silicide film is provided on the contact formation region of the drain region included in the first heavily doped layer.

6. The semiconductor device of claim 3, wherein
the insulation film is provided on the drain region included in the first heavily doped layer while the second silicide film is not provided.

7. The semiconductor device of claim 6, wherein the first MIS transistor serves as a transistor of internal circuit protection circuit.

8. The semiconductor device of claim 1, wherein
the first sidewall is made of a silicon oxide film, and
the second sidewall is made of a silicon nitride film.

9. The semiconductor device of claim 1, further comprising a second MIS transistor,
wherein in the second MIS transistor, an isolation region surrounds sides of the second active region of a semiconductor substrate,
the second MIS transistor further comprises:
the isolation region;
a second gate insulation film formed on the second active region;
a second gate electrode provided on the second gate insulation film, and
a second impurity doped layer provided in part of the second active region located under a side of the second gate electrode,
wherein the insulation film covers the second gate electrode and the second impurity doped layer.

10. The semiconductor device of claim 9, wherein the second gate insulation film has a thickness larger than the first gate insulation film.

11. The semiconductor device of claim 9, wherein the second MIS transistor serves as a transistor of peripheral circuit protection circuit.

12. The semiconductor device of claim 1, wherein an inter-level insulation film is provided over the insulation film.

13. A method for fabricating a semiconductor device, the method comprising the steps of:
   a) forming an isolation region surrounding sides of an active region of a semiconductor substrate;
   b) forming, after the step a), a gate insulation film on the active region;
   c) forming, after the step b), a gate electrode on the gate insulation film;
   d) forming, after the step a), a resistor element including silicon on the isolation region;
   e) injecting, after the step c), a first impurity into part of the active region located under a side of the gate electrode by ion implantation to form an impurity doped layer,
   f) forming, after the step d), an insulation film so as to cover part of the resistor element and not to cover an upper surface of the gate insulation film;
   g) performing, after the step f), thermal treatment to activate the impurity in the first impurity doped layer;
   h) after the step g), performing, with a metal film formed over the semiconductor substrate, thermal treatment to form a first silicide film on the gate electrode and a second silicide layer on the first impurity doped layer; and
   i) after the step h), forming a first contact plug directly connected to the second silicide film and forming a second contact plug directly connected to the resistor element; and
   j) after the step d) and before the step f), forming a first sidewall over the side surface of the resister element; and
   k) forming a second sidewall over the side surface of the resistor element with the first sidewall interposed therebetween,
   wherein in the step f), an insulation film is formed so as to cover part of the resistor element and cover the first and second sidewalls,
   in the step i), the silicide film is not provided between the resistor element and the second contact plug,
   the first impurity doped layer includes source and drain regions, and
   in the step f), part of the insulation film located in part of the drain region other than a contact formation region is left.

14. The method of claim 13, wherein in the step f), upper and side surfaces are covered by the insulation film.

15. The method of claim 14, wherein in the step f), after the insulation film has been formed over the upper surface of the semiconductor substrate, part of the insulation film located on the gate electrode is removed.

* * * * *